United States Patent
Yao et al.

(10) Patent No.: US 9,378,696 B2
(45) Date of Patent: Jun. 28, 2016

(54) SHIFT REGISTER UNIT AND DRIVING METHOD, SHIFT REGISTER CIRCUIT AND DISPLAY APPARATUS

(71) Applicant: BOE TECHNOLOGY GROUP CO., LTD., Beijing (CN)

(72) Inventors: Xing Yao, Beijing (CN); Seung Woo Han, Beijing (CN); Jing Lv, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 3 days.

(21) Appl. No.: 14/373,816

(22) PCT Filed: Dec. 17, 2013

(86) PCT No.: PCT/CN2013/089640
§ 371 (c)(1),
(2) Date: Jul. 22, 2014

(87) PCT Pub. No.: WO2015/000271
PCT Pub. Date: Jan. 8, 2015

(65) Prior Publication Data
US 2015/0077319 A1    Mar. 19, 2015

(30) Foreign Application Priority Data

Jul. 3, 2013   (CN) .......................... 2013 1 0283411

(51) Int. Cl.
*G09G 3/36* (2006.01)
*G09G 3/20* (2006.01)
(Continued)

(52) U.S. Cl.
CPC ................ *G09G 3/3674* (2013.01); *G09G 3/20* (2013.01); *G09G 3/3266* (2013.01);
(Continued)

(58) Field of Classification Search
CPC ............. G09G 3/3659; G09G 3/3674–3/3681; G09G 2310/00–2310/0216; G09G 2310/0262–2310/0267; G09G 2310/0278–2310/0283; G09G 2310/062; G09G 2310/067
See application file for complete search history.

(56) References Cited

U.S. PATENT DOCUMENTS

2005/0275614 A1*  12/2005  Kim ..................... G09G 3/3674
                                                            345/100
2007/0035505 A1*  2/2007   Lin ...................... G09G 3/3648
                                                            345/100
(Continued)

FOREIGN PATENT DOCUMENTS

CN          1707589 A       12/2005
CN          1941063 A       4/2007
(Continued)

OTHER PUBLICATIONS

English translation of the Written Opinion of the International Searching Authority of PCT/CN2013/089640, mailed Apr. 3, 2014.
(Continued)

*Primary Examiner* — Sanghyuk Park
(74) *Attorney, Agent, or Firm* — Collard & Roe, P.C.

(57) ABSTRACT

A shift register unit and a driving method and a display apparatus can realize outputting of two gate line signals in one shift register unit, which is convenient to a circuit integration design of products and also facilitates an implementation of a narrow bezel product. The shift register unit comprises a first input module, a second input module, a first gate line driving signal module, a second gate line driving signal module, a pulling-down module and a resetting module.

19 Claims, 9 Drawing Sheets

(51) Int. Cl.
  *G11C 19/28* (2006.01)
  *G09G 3/32* (2016.01)
(52) U.S. Cl.
  CPC ............ *G09G 3/3677* (2013.01); *G11C 19/28* (2013.01); *G09G 2300/08* (2013.01); *G09G 2310/0267* (2013.01); *G09G 2310/0286* (2013.01)

(56) References Cited

U.S. PATENT DOCUMENTS

| | | | |
|---|---|---|---|
| 2007/0146289 A1 | 6/2007 | Lee et al. | |
| 2008/0055225 A1* | 3/2008 | Pak | G09G 3/3677 345/96 |
| 2008/0088555 A1* | 4/2008 | Shin | G09G 3/3677 345/87 |
| 2011/0044423 A1* | 2/2011 | Lin | G09G 3/32 377/64 |
| 2011/0058642 A1* | 3/2011 | Tsai | G09G 3/3677 377/79 |
| 2014/0168044 A1 | 6/2014 | Hu et al. | |

FOREIGN PATENT DOCUMENTS

| | | |
|---|---|---|
| CN | 103035298 A | 4/2013 |
| CN | 103345941 A | 10/2013 |
| CN | 203325406 U | 12/2013 |

OTHER PUBLICATIONS

International Search Report, International Preliminary Report on Patentability and Written Opinion of the International Searching Authority of PCT/CN2013/089640 in Chinese, mailed Apr. 3, 2014.
Chinese Office Action of Chinese Application No. 201310283411.1, mailed Aug. 6, 2015 with English translation.
English Translation of the International Search Report of PCT/CN2013/089640 published in English on Jan. 8, 2015.

* cited by examiner

SHIFT REGISTER UNIT AND DRIVING METHOD, SHIFT REGISTER CIRCUIT AND DISPLAY APPARATUS

CROSS REFERENCE TO RELATED APPLICATIONS

This application is the National Stage of PCT/CN2013/089640 filed on Dec. 17, 2013, which claims priority under 35 U.S.C. §119 of Chinese Application No. 201310283411.1 filed on Jul. 3, 2013, the disclosure of which is incorporated by reference.

TECHNICAL FIELD

The present disclosure relates to a field of manufacture of displays, and in particular to a shift register unit and a driving method, a shift register circuit, and a display apparatus.

BACKGROUND

In recent years, a development of the display has a trend toward to a high level of integration and a low cost. A very important technique is a realization of a mass production of GOAs (Gate Driver on Array). By integrating a gate switching circuit onto an array substrate of a display panel using the GOA technology, a gate driving integrated circuit portion can be omitted, such that a production cost can be reduced in terms of both a material cost and a manufacturing process. Such a gate switching circuit integrated on an array substrate using the GOA technology is also known as a GOA circuit or a shift register circuit.

In this regard, the shift register circuit comprises a number of shift register units each corresponding to a gate line. In particular, an output terminal of each of the shift register units is connected to a gate line; and an output terminal of one shift register unit is connected to an input terminal of a next shift register unit. The inventor has found that in a conventional shift register circuit, each shift register unit provides a signal input only for the gate line of corresponding one row of pixels. In this case, the number of GOA unit circuits is required to be the same as the number of gate lines in the display region. Therefore, as a resolution is higher and higher, the number of GOA unit circuits required increases as well. This is disadvantageous to an integration design of products, and in particular, to implementation of narrow bezel products.

SUMMARY

Embodiments of the present disclosure provide a shift register unit, a driving method, a shift register circuit, and a display apparatus, which enables one shift register unit to realize outputs of two gate line signals, is convenient to a circuit integration design of products, and also facilitates an implementation of narrow bezel products.

To attain the above objects, following technical solutions are employed in the embodiments of the present disclosure.

In an aspect, there is provided a shift register unit comprising a first input module, a second input module, a first gate line driving signal module, a second gate line driving signal module, a pulling-down module and a resetting module;

the first input module is connected to an input terminal and a first node, and is configured to input a first voltage to the first node;

the first gate line driving signal module is connected to a first clock signal terminal, a first output terminal and the first node, and is configured to store the first voltage and output a first gate line driving signal through the first output terminal under controls of the first voltage and a clock signal of the first clock signal terminal;

the second input module is connected to a second node and the first output terminal, and is configured to output a second voltage to the second node under an action of the first gate line driving signal;

the second gate line driving signal module is connected to a third node, a second output terminal, a second clock signal terminal and the second node, and is configured to output a second gate line driving signal through the second output terminal under controls of the second voltage and a clock signal of the second clock signal terminal, and output a third voltage at the third node;

the pulling-down module is connected to a reference voltage terminal, the first node, the second node, the third node, the first output terminal and the second output terminal, and is configured to pull voltages of the third node and the second output terminal to a voltage of the reference voltage terminal when the first output terminal outputs the first gate line driving signal, and pull voltages of the first node and the first output terminal to the voltage of the reference voltage terminal when the second output terminal outputs the second gate line driving signal; and the resetting module is connected to a reset terminal, the second node, the second output terminal and the reference voltage terminal, and is configured to pull voltages of the second node and the second output terminal to the voltage of the reference voltage terminal under a control of a signal of the reset terminal.

Optionally, the pulling-down module comprises a first pulling-down unit, a second pulling-down unit and a resetting unit;

the first pulling-down unit is connected to the first node, the third node, the second output terminal and the reference voltage terminal, and is configured to pull the voltages of the second output terminal and the third node to the voltage of the reference voltage terminal under the control of the first voltage;

the second pulling-down unit is connected to the first node, the third node, the first output terminal and the reference voltage terminal, and is configured to pull the voltages of the first node and the first output terminal to the voltage of the reference voltage terminal under the control of the third voltage; and the resetting unit is connected to the first node, the first output terminal, the second output terminal and the reference voltage terminal, and is configured to pull the voltages of the first node and the first output terminal to the voltage of the reference voltage terminal under the control of the second gate line driving signal of the second output terminal.

Optionally, the pulling-down module further comprises:

a first output control unit connected to the second node, the first output terminal and the reference voltage terminal, and configured to pull the voltage of the first output terminal to the voltage of the reference voltage terminal under the control of the second voltage when the voltage of the second node reaches the second voltage.

Optionally, the first input module comprises:

a first switch transistor, wherein a source and a gate of the first switch transistor are connected to the input terminal, and a drain of the first switch transistor is connected to the first node.

Optionally, the first gate line driving signal module comprises a second switch transistor and a first capacitor;

a first electrode of the first capacitor is connected to a gate of the second switch transistor and the first node, a second electrode of the first capacitor is connected to a drain of the second switch transistor, a source of the second switch transistor is connected to the first clock signal terminal, and the drain of the second switch transistor is connected to the first output terminal.

Optionally, the second input module comprises a third switch transistor, a source and a gate of the third switch transistor are connected to the first output terminal, and a drain of the third switch transistor is connected to the second node.

Optionally, the second gate line driving signal module comprises a fourth switch transistor and a second capacitor;

a source of the fourth switch transistor is connected to the second clock signal terminal, a gate of the fourth switch transistor is connected to the second node, and a drain of the fourth switch transistor is connected to the second output terminal; and a first electrode of the second capacitor is connected to the second node, a second electrode of the second capacitor is connected to the second output terminal, and the second output terminal is connected to the third node.

Optionally, the second gate line driving signal module comprises a fourth switch transistor, an eighth switch transistor and a second capacitor;

a source of the fourth switch transistor is connected to the second clock signal terminal, a gate of the fourth switch transistor is connected to the second node, and a drain of the fourth switch transistor is connected to the second output terminal;

a gate of the eighth switch transistor is connected to the second output terminal, a source of the eighth switch transistor is connected to the second clock signal terminal, and a drain of the eighth switch transistor is connected to the third node; and a first electrode of the second capacitor is connected to the second node, and a second electrode of the second capacitor is connected to the second output terminal.

Optionally, the second output terminal is connected to the third node.

Optionally, the resetting module comprises a thirteenth switch transistor and a fourteenth switch transistor;

a gate of the thirteenth switch transistor is connected to the reset terminal, a source of the thirteenth switch transistor is connected to the second node, and a drain of the thirteenth switch transistor is connected to the reference voltage terminal; and a gate of the fourteenth switch transistor is connected to the reset terminal, a source of the fourteenth switch transistor is connected to the second output terminal, and a drain of the fourteenth switch transistor is connected to the reference voltage terminal.

Optionally, the first pulling-down unit comprises a seventh switch transistor;

a gate of the seventh switch transistor is connected to the first node, a source of the seventh switch transistor is connected to the third node, and a drain of the seventh switch transistor is connected to the reference voltage terminal.

Optionally, the first pulling-down unit further comprises a sixth switch transistor, a gate of the sixth switch transistor is connected to the first node, a source of the sixth switch transistor is connected to the second output terminal, and a drain of the sixth switch transistor is connected to the reference voltage terminal.

Optionally, the second pulling-down unit comprises:

a ninth switch transistor and a tenth switch transistor, wherein a gate of the ninth switch transistor is connected to the third node, a source of the ninth switch transistor is connected to the first node, and a drain of the ninth switch transistor is connected to the reference voltage terminal; and a gate of the tenth switch transistor is connected to the third node, a source of the tenth switch transistor is connected to the first output terminal, and a drain of the tenth switch transistor is connected to the reference voltage terminal.

Optionally, the resetting unit comprises:

an eleventh switch transistor and a twelfth switch transistor;

a gate of the eleventh switch transistor is connected to the second output terminal, a source of the eleventh switch transistor is connected to the first node, and a drain of the eleventh switch transistor is connected to the reference voltage terminal; and a gate of the twelfth switch transistor is connected to the second output terminal, a source of the twelfth switch transistor is connected to the first output terminal, and a drain of the twelfth switch transistor is connected to the reference voltage terminal.

Optionally, the first output control unit comprises a fifth switch transistor;

a gate of the fifth switch transistor is connected to the second node, a source of the fifth switch transistor is connected to the first output terminal, and a drain of the fifth switch transistor is connected to the reference voltage terminal.

In an aspect, there is provided a driving method for a shift register unit, comprising:

in a first phase, a first input module receives an input signal through an input terminal to input a first voltage to a first node until a potential at the first node reaches the first voltage, the first voltage is stored by a first gate line driving signal module, and the potential at the first node is maintained at the first voltage;

in a second stage, the first voltage controls the first gate line driving signal module to output a signal of a first clock signal terminal through a first output terminal as a first gate line driving signal, the first voltage controls a pulling-down module to pull voltages of a third node and a second output terminal to a voltage of a reference voltage terminal, a second input module inputs a second voltage to a second node under an action of the first gate line driving signal until a potential at the second node reaches the second voltage, the second voltage is stored by the second gate line driving signal module, and the potential at the second node is maintained at the second voltage;

in a third stage, the second voltage controls the second gate line driving signal module to output a signal of a second clock signal terminal through the second output terminal as a second gate line driving signal, the second gate line driving signal controls the third node to output a third voltage, the third node controls the pulling-down module to pull voltages of the first node and the first output terminal to the voltage of the reference voltage terminal, and the second gate line driving signal controls the pulling-down module to pull the voltages of the first node and the first output terminal to the voltage of the reference voltage terminal; and in a fourth stage, a resetting module receives a reset signal through a reset terminal to pull voltages of the second node and the second output terminal to the voltage of the reference voltage terminal.

Optionally, when the pulling-down module comprises a first pulling-down unit, a second pulling-down unit and a resetting unit, the second stage further comprises that the first voltage controls the first pulling-down module to pull the voltages of the third node and the second output terminal to the voltage of the reference voltage terminal;

the third stage further comprises that the third node controls the second pulling-down unit to pull the voltages of the first node and the first output terminal to the voltage of the reference voltage terminal, and the second gate line driving signal controls the resetting unit to pull the voltages of the first node and the first output terminal to the voltage of the reference voltage terminal.

Optionally, when the pulling-down module further comprises a first output control unit, the third stage further comprises that the second voltage controls the first output control unit to pull the voltage of the first output terminal to the voltage of the reference voltage terminal.

Optionally, when the first input module of the shift register unit comprises a first switch transistor, the first stage further comprises that the first switch transistor is turned on.

Optionally, when the first gate line driving signal module of the shift register unit comprises a second switch transistor and a first capacitor, the first stage further comprises that the first capacitor is charged by the first voltage until the voltage at the first node rises to the first voltage, the first voltage is stored by the first capacitor, and the second switch transistor is turned on;

the second stage further comprises that the second switch transistor is turned on.

Optionally, when the second input module of the shift register unit comprises a third switch transistor, the second stage farther comprises that the third switch transistor is turned on.

Optionally, when the second gate line driving signal module of the shift register unit comprises a fourth switch transistor and a second capacitor, the second stage further comprises that the second capacitor is charged by the second voltage until the voltage at the second node rises to the second voltage, the second voltage is stored by the second capacitor, and the fourth switch transistor is turned on;

the third stage further comprises that the fourth switch transistor is turned on.

Optionally, when the second gate line driving signal module of the shift register unit comprises a fourth switch transistor, an eighth switch transistor and a second capacitor, the second stage further comprises that the second capacitor is charged by the second voltage until the voltage at the second node rises to the second voltage, the second voltage is stored by the second capacitor, and the fourth switch transistor is turned on;

the third stage further comprises that the fourth switch transistor is turned on, and the eighth switch transistor is turned on.

Optionally, when the resetting module of the shift register unit comprises a thirteenth switch transistor and a fourteenth switch transistor, the fourth stage comprises that the thirteenth switch transistor and the fourteenth switch transistor are turned on.

Optionally, when the first pulling-down unit of the shift register unit comprises a seventh switch transistor, the second stage further comprises that the seventh switch transistor is turned on.

Optionally, when the first pulling-down unit of the shift register unit further comprises a sixth switch transistor, the second stage further comprises that the sixth switch transistor is turned on.

Optionally, when the second pulling-down unit of the shift register unit comprises a ninth switch transistor and a tenth switch transistor, the third stage further comprises that the ninth switch transistor is turned on, and the tenth switch transistor is turned on.

Optionally, when the resetting unit of the shift register unit comprises an eleventh switch transistor and a twelfth switch transistor, the third stage further comprises that the eleventh switch transistor and the twelfth switch transistor are turned on.

Optionally, when the first output control unit of the shift register unit comprises a fifth switch transistor, the third stage further comprises that the fifth switch transistor is turned on.

In an aspect, there is provided a shift register circuit comprising a plurality of shift register units connected in cascade, and each of the shift register units is any one of the shift register units as described above;

except for the first shift register unit and the last shift register unit, an input terminal of each of the shift register units is connected to a second output terminal of the adjacent previous shift register unit, a first output terminal of each of the shift register units is connected to a reset terminal of the adjacent previous shift register unit, the second output terminal of each of the shift register units is connected to the input terminal of the adjacent next shift register unit, and the reset terminal of each of the shift register units is connected to the first output terminal of the adjacent next shift register unit.

In an aspect, there is provided a display apparatus comprising the shift register circuit as described above.

In the shift register unit and the driving method thereof, the shift register circuit and the display apparatus provided by the embodiments of the present disclosure, the utilization of two gate line driving signal modules enables one shift register unit to realize the outputs of two gate line signals, which is convenient to the circuit integration design of products, and also facilitates the implementation of narrow bezel products.

BRIEF DESCRIPTION OF THE DRAWINGS

To describe the technical solutions of the embodiments of the present disclosure or the prior art more clearly, accompanying drawings to be used in the description of the embodiments or the prior art will be briefly introduced below.

DETAILED DESCRIPTION

Figure 1:
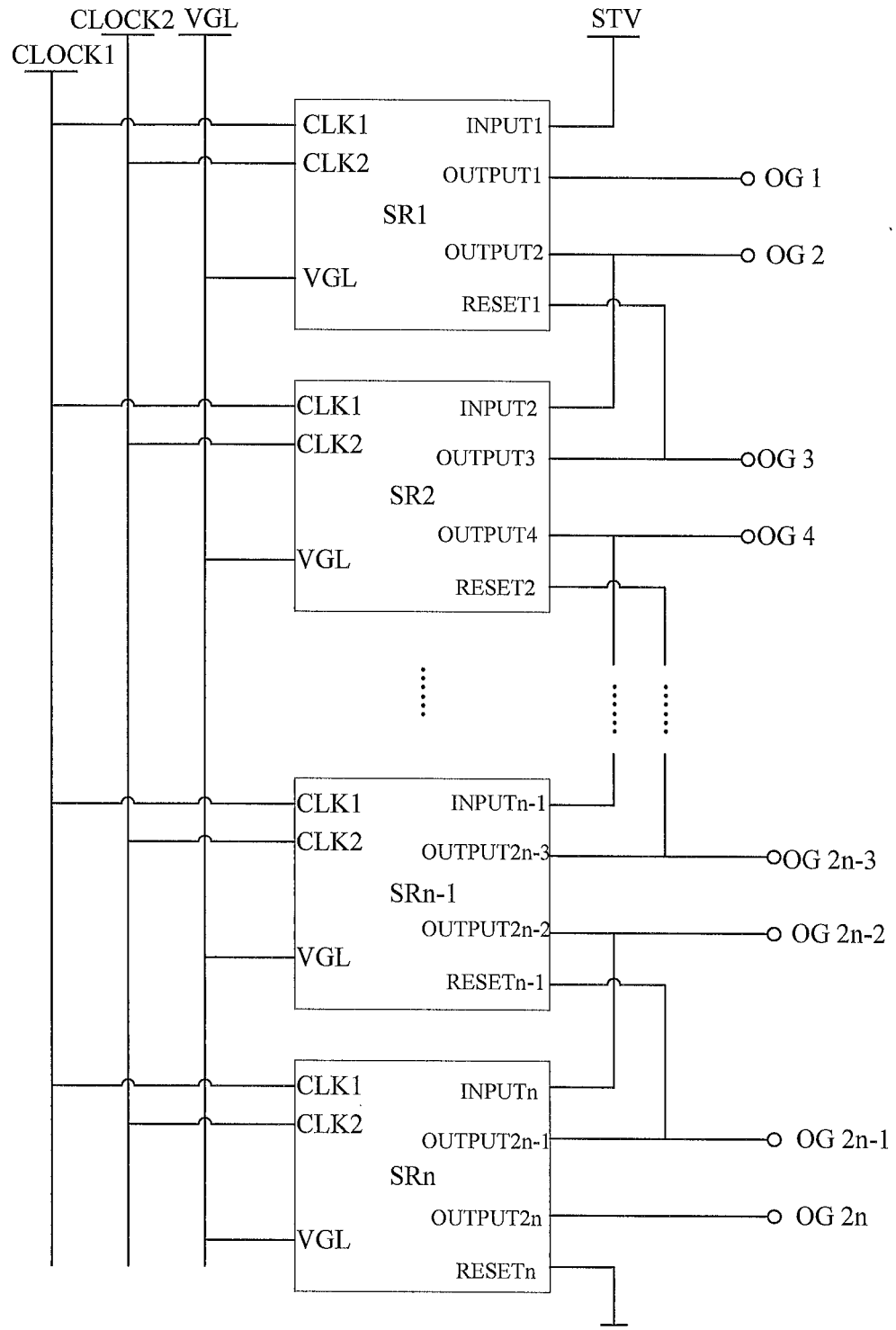
FIG. 1 is a schematic diagram showing a circuit structure of a shift register circuit provided by an embodiment of the present disclosure.

Thereafter, solutions of embodiments of the present disclosure will be described clearly and completely in connection with drawings of the embodiments of the present disclosure, but obviously the described embodiments are only some, but not all of the embodiments of the present disclosure.

Transistors employed in any embodiments of the present disclosure can be thin film transistors, field-effect transistors or other devices with similar characteristics. Since a source and a drain of the transistor employed herein are symmetric with each other, the source and the drain are not differentiated from each other. In embodiments of the present disclosure, in order to differentiate between the two electrodes except for the gate of the transistor, one of the electrodes is called as the source, the other is called as the drain. In terms of what is shown in the accompanying drawings, it is defined that a middle terminal of the transistor is the gate, a signal input terminal is the source, and a signal output terminal is the drain. In addition, the transistors employed in embodiments of the present disclosure are all P-type or N-type transistors. The P-type transistor is turned on when its gate is at a low level. The N-type transistor is turned on when its gate is at a high level.

An embodiment of the present disclosure provides a shift register circuit, comprising a plurality of shift register units connected in series. Each of the shift register units comprises a first output terminal and a second output terminal. Each of the first output terminal and the second output terminal is connected to a gate line. Except for the first shift register unit and the last shift register unit, an input terminal of each of the shift register units is connected to a second output terminal of the adjacent previous shift register unit, a first output terminal of each of the shift register units is connected to a reset terminal of the adjacent previous shift register unit, the second output terminal of each of the shift register units is connected to the input terminal of the adjacent next shift register unit, and the reset terminal of each of the shift register units is connected to the first output terminal of the adjacent next shift register unit. Further, the input terminal of the first shift register unit receives a frame start signal (STV), the first output terminal of the first shift register unit is connected to a gate line, the second output terminal of the first shift register unit is connected to the input terminal of the second shift register unit; the input terminal of the last shift register unit is connected to the second output terminal of the previous shift register unit adjacent thereto, the first output terminal of the last shift register unit is connected to the reset terminal of the previous shift register unit adjacent thereto, and the reset terminal of the last shift register unit is left unused or is connected to its own reset terminal, or may be connected to an output terminal of a redundant shift register unit.

The redundant shift register unit is at least one shift register unit mainly added for the last shift register unit. However, the output terminal of any one of the added shift register units is not connected to any gate line for outputting gate signals, and they just function to reset the last shift register unit. Therefore, a structure of the redundant shift register units can be the same as or different from the structure of the shift register units of the present application.

Specifically, a shift register circuit as shown in FIG. 1 comprises a plurality of shift register units connected in cascade, in which a first output terminal OUTPUT1 of a shift register unit SR1 is connected to a gate line OG1; a second output terminal OUTPUT2 of the shift register unit SR1 is connected to a gate line OG2, and also connected to an input terminal INTPUT2 of a shift register unit SR2; a first output terminal OUTPUT3 of the shift register unit SR2 is connected to a reset terminal RESET1 of the shift register unit SR1, and connected to a gate line OG3; a second output terminal OUTPUT4 of the shift register unit SR2 is connected to an input terminal of a next shift register unit, and connected to a gate line OG4; a first output terminal OUTPUT2$n$-1 of a shift register unit SR$n$ is connected to a reset terminal RESET$n$-1 of a previous shift register unit, and connected to a gate line OG2$n$-1; a second output terminal OUTPUT2$n$ of the shift register unit SR$n$ is connected to a gate line OG2$n$; and remaining shift register units are connected in a similar way.

Figure 9:
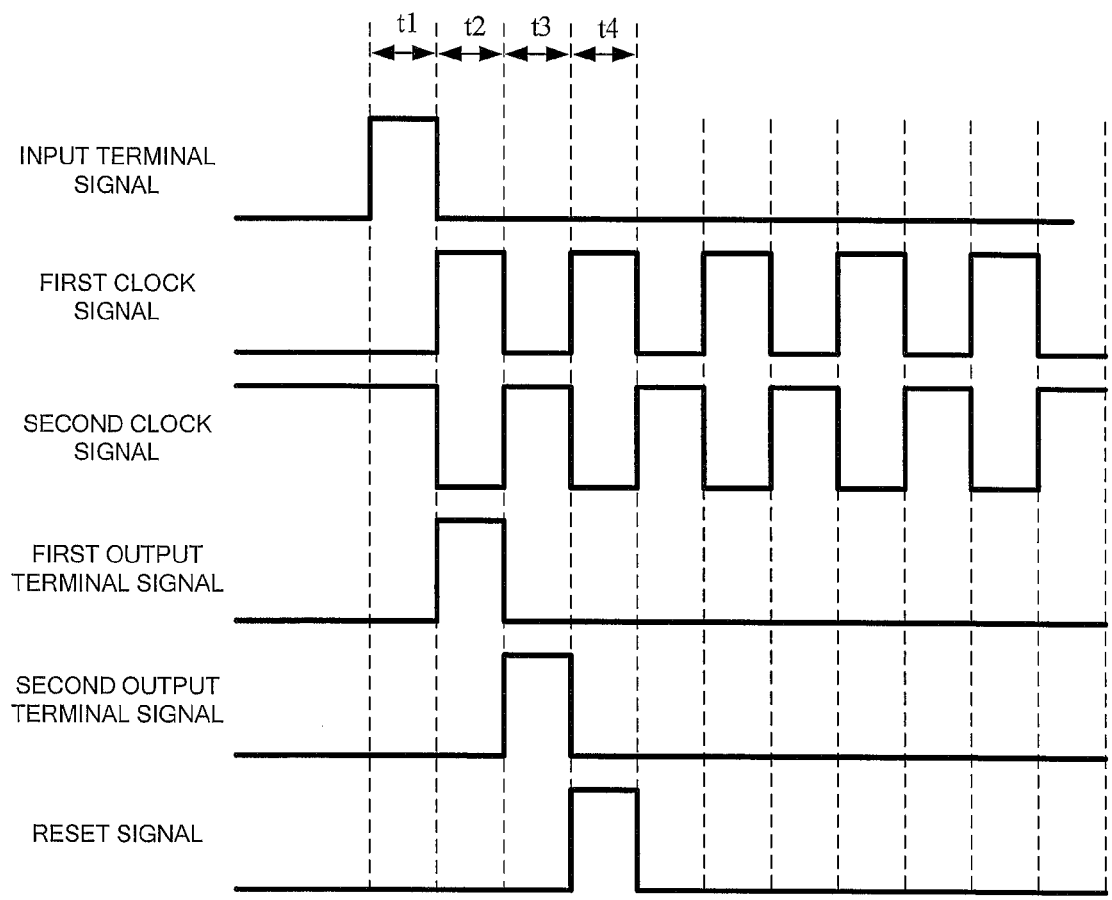
FIG. 9 is a driving timing signal diagram of a shift register unit provided by an embodiment of the present disclosure.

Each of the shift register units comprises a first clock signal terminal CLK1, a second clock signal terminal CLK2 and a reference voltage terminal VGL. The first clock signal terminal CLK1 is connected to a first clock signal CLOCK1 of the system, the second clock signal terminal CLK2 is connected to a second clock signal CLOCK2 of the system and the reference voltage terminal VGL is connected to a common voltage VGL. Referring to signal timing diagrams shown in FIG. 9 or 10 (comprising an input terminal signal, the first clock signal, the second clock signal, a first output terminal signal, a second output terminal signal, and a reset signal), a duty cycle between a high level and a low level of the system clock signals CLOCK1 and CLOCK2 are both 1:2 (that is, the duty cycles of CLOCK1 and CLOCK2 are both 50%), and the two signals have opposite phases. That is, upon end of a low level signal of CLOCK1, a low level signal of CLOCK2 starts, and upon end of said low level signal of CLOCK2, a next low level clock signal of CLOCK1 starts, and so on. The same applies to outputs of high level signals, and this will not be repeated herein. In the present embodiment, the first shift register unit is SR1, thus the input signal INPUT1 of the shift register unit SR1 (which is shown as the input terminal signal in FIG. 9 and FIG. 10) is an activation pulse signal. In an example, the activation pulse signal may be a frame start signal STV, for example, and the first clock signal CLOCK1 of the system starts to be output upon end of the STV signal.

Figure 2:
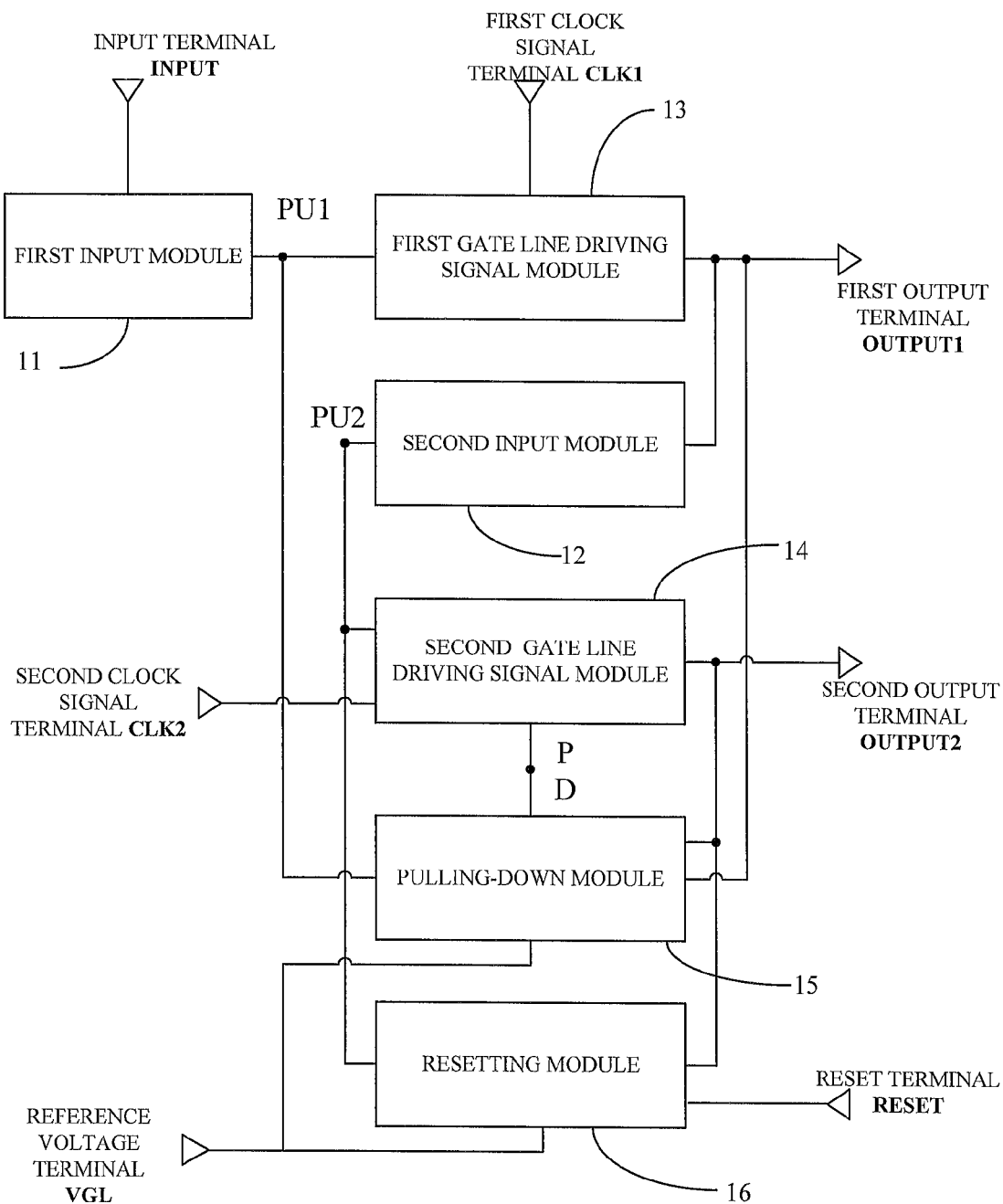
FIG. 2 is a schematic diagram showing a structure of a shift register unit provided by an embodiment of the present disclosure.

FIG. 2 is a schematic diagram showing the structure of any one of the shift register units in the afore-said shift register circuit provided by an embodiment of the present disclosure, which comprises a first input module 11, a second input module 12, a first gate line driving signal module 13, a second gate line driving signal module 14, a pulling-down module 15 and a resetting module 16.

The first input module 11 is connected to an input terminal INPUT and a first node PU1, and inputs a first voltage V1 to the first node PU1.

The first gate line driving signal module 13 is connected to the first clock signal terminal CLK1, the first output terminal OUTPUT1 and the first node PU1, stores the first voltage V1, and outputs a first gate line driving signal through the first output terminal OUTPUT1 under controls of the first voltage V1 and a clock signal of the first clock signal terminal CLK1.

The second input module 12 is connected to a second node PU2 and the first output terminal OUTPUT1, and outputs a second voltage V2 to the second node PU2 under an action of the first gate line driving signal.

The second gate line driving signal module 14 is connected to a third node PD, the second output terminal OUTPUT2, the second clock signal terminal CLK2 and the second node PU2, outputs a second gate line driving signal through the second output terminal OUTPUT2 under controls of the second voltage V2 and a clock signal of the second clock signal terminal CLK2, and outputs a third voltage V3 at the third node PD.

The pulling-down module 15 is connected to the reference voltage terminal VGL, the first node PU1, the third node PD, the first output terminal OUTPUT1 and the second output terminal OUTPUT2, pulls voltages of the third node PD and the second output terminal OUTPUT2 to a voltage of the reference voltage terminal VGL when the first output terminal OUTPUT1 outputs the first gate line driving signal, and pulls voltages of the first node PU1 and the first output terminal OUTPUT1 to the voltage of the reference voltage terminal VGL when the second output terminal OUTPUT2 outputs the second gate line driving signal.

The resetting module 16 is connected to the reset terminal RESET, the second node PU2, the second output terminal OUTPUT2 and the reference voltage terminal VGL, and pulls voltages of the second node PU2 and the second output terminal OUTPUT2 to the voltage of the reference voltage terminal VGL under a control of a signal of the reset terminal RESET.

Figure 3:
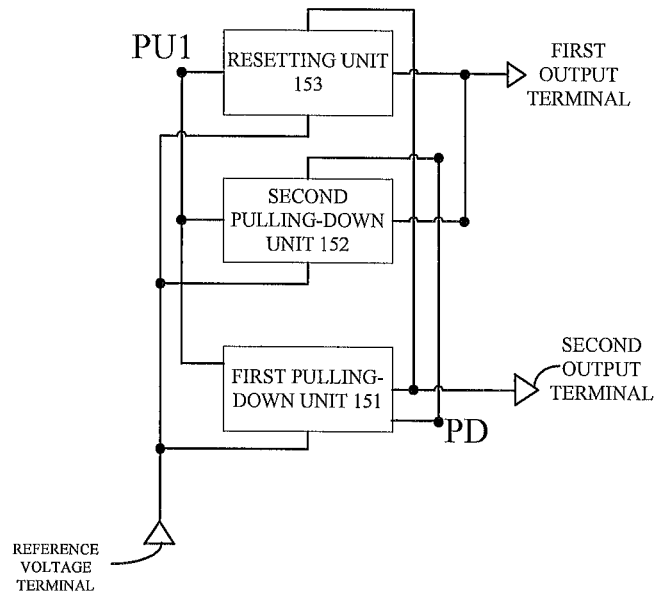
FIG. 3 is a schematic diagram showing a structure of a pulling-down module provided by an embodiment of the present disclosure.

In an example, as shown in FIG. 3, the pulling-down module 15 comprises a first pulling-down unit 151, a second pulling-down unit 152, and a resetting unit 153.

The first pulling-down unit 151 is connected to the first node PU1, the third node PD, the second output terminal OUTPUT2 and the reference voltage terminal VGL, and pulls the voltages of the second output terminal OUTPUT2 and the third node PD to the voltage of the reference voltage terminal VGL under the control of the first voltage V1.

The second pulling-down unit 152 is connected to the first node PU1, the third node PD, the first output terminal OUTPUT1 and the reference voltage terminal VGL, and pulls the voltages of the first node PU1 and the first output terminal OUTPUT1 to the voltage of the reference voltage terminal VGL under the control of the third voltage V3.

The resetting unit 153 is connected to the first node PU1, the first output terminal OUTPUT1, the second output terminal OUTPUT2 and the reference voltage terminal VGL, and pulls the voltages of the first node PU1 and the first output terminal OUTPUT1 to the voltage of the reference voltage terminal VGL under the control of the second gate line driving signal of the second output terminal OUTPUT2.

Figure 4:
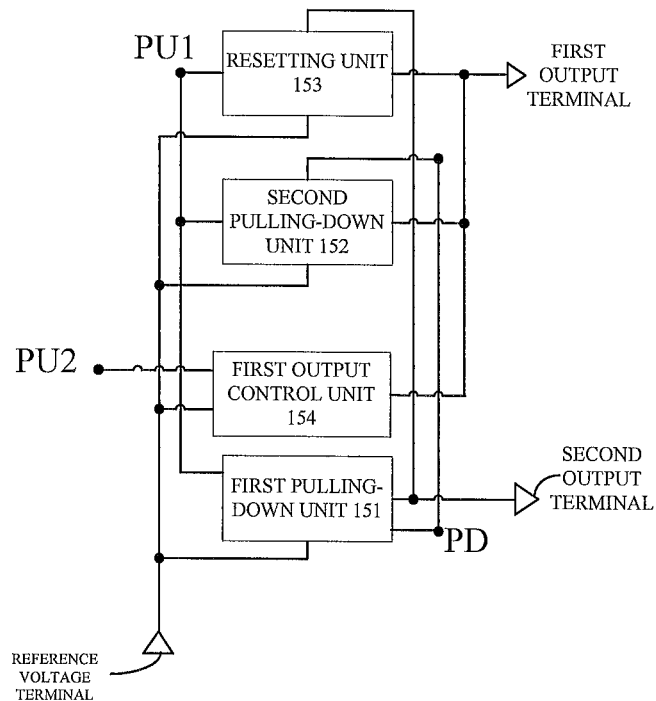
FIG. 4 is a schematic diagram showing a structure of another pulling-down module provided by an embodiment of the present disclosure.

Further, as shown in FIG. 4, the pulling-down module 15 further comprises:

a first output control unit 154, connected to the second node PU2, the first output terminal OUTPUT1 and the reference voltage terminal VGL, and configured to pull the voltage of the first output terminal OUTPUT1 to the voltage of the reference voltage terminal VGL under the control of the second voltage V2 when the voltage of the second node PU2 reaches the second voltage V2.

In the shift register unit provided by the embodiment of the present disclosure, the utilization of the two gate line driving signal modules enables one shift register unit to realize the outputting of two gate line signals, which is convenient to circuit integration designs of products and also facilitates an implementation of a narrow bezel product.

Figure 5:
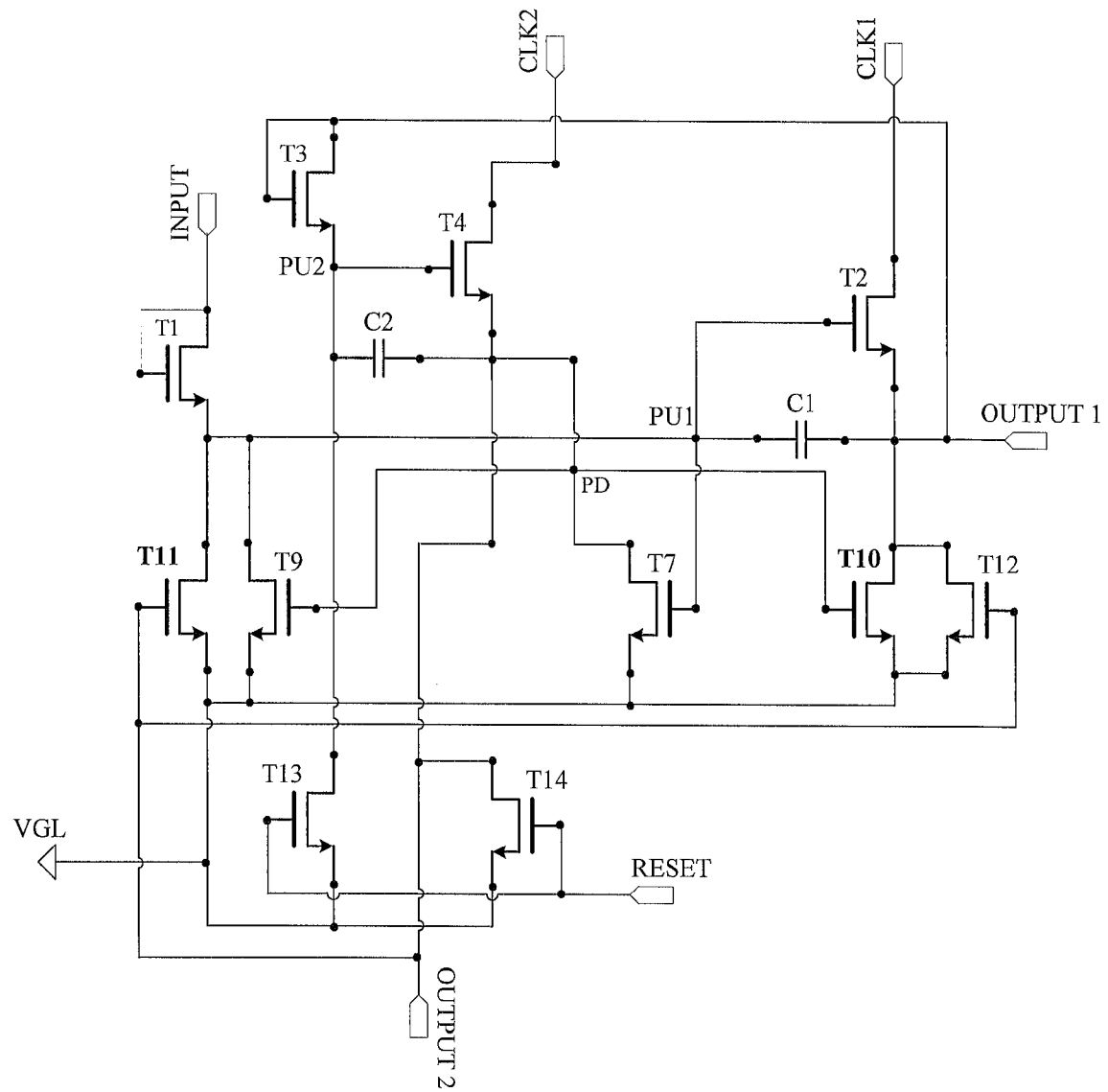
FIG. 5 is a schematic diagram showing a circuit structure of a shift register unit provided by an embodiment of the present disclosure.

Referring to FIG. 5, which shows a schematic diagram of a circuit structure of a shift register unit provided by another embodiment of the present disclosure. The shift register unit comprises a first input module, a second input module, a first gate line driving signal module, a second gate line driving signal module, a pulling-down module, and a resetting module.

The first input module comprises a first switch transistor T1. A source and a gate of the first switch transistor T1 are connected to the input terminal INPUT, and a drain of the first switch transistor T1 is connected to the first node PU1.

The first gate line driving signal module comprises a second switch transistor T2 and a first capacitor C1. A first electrode of the first capacitor C1 is connected to a gate of the second switch transistor T2 and the first node PU1, a second electrode of the first capacitor C1 is connected to a drain of the second switch transistor T2, a source of the second switch transistor T2 is connected to the first clock signal terminal CLK1, and the drain of the second switch transistor T2 is connected to the first output terminal OUTPUT1.

The second input module comprises a third switch transistor T3. A source and a gate of the third switch transistor T3 are connected to the first output terminal OUTPUT1, and a drain of the third switch transistor T3 is connected to the second node PU2.

The second gate line driving signal module comprises a fourth switch transistor T4 and a second capacitor C2. A source of the fourth switch transistor T4 is connected to the second clock signal terminal CLK2, a gate of the fourth switch transistor T4 is connected to the second node PU2, and a drain of the fourth switch transistor T4 is connected to the second output terminal OUTPUT2. A first electrode of the second capacitor C2 is connected to the second node PU2, a second electrode of the second capacitor C2 is connected to the second output terminal OUTPUT2, and the second output terminal OUTPUT2 is connected to the third node PD.

The pulling-down module comprises a first pulling-down unit, a second pulling-down unit, and a resetting unit.

The first pulling-down unit comprises a seventh switch transistor T7. A gate of the seventh switch transistor T7 is connected to the first node PU1, a source of the seventh switch transistor T7 is connected to the second output terminal OUTPUT2, and a drain of the seventh switch transistor T7 is connected to the reference voltage terminal VGL.

The second pulling-down unit comprises a ninth switch transistor T9 and a tenth switch transistor T10. A gate of the ninth switch transistor T9 is connected to the second output terminal OUTPUT2, a source of the ninth switch transistor T9 is connected to the first node PU1, and a drain of the ninth switch transistor T9 is connected to the reference voltage terminal VGL. A gate of the tenth switch transistor T10 is connected to the second output terminal OUTPUT2, a source of the tenth switch transistor T10 is connected to the first output terminal OUTPUT1, and a drain of the tenth switch transistor T10 is connected to the reference voltage terminal VGL.

The resetting unit comprises an eleventh switch transistor T11 and a twelfth switch transistor T12. A gate of the eleventh switch transistor T11 is connected to the second output terminal OUTPUT2, a source of the eleventh switch transistor T11 is connected to the first node PU1, and a drain of the eleventh switch transistor T11 is connected to the reference voltage terminal VGL. A gate of the twelfth switch transistor T12 is connected to the second output terminal OUTPUT2, a source of the twelfth switch transistor T12 is connected to the first output terminal OUTPUT1, and a drain of the twelfth switch transistor T12 is connected to the reference voltage terminal VGL.

The resetting module comprises a thirteenth switch transistor T13 and a fourteenth switch transistor T14. A gate of the thirteenth switch transistor T13 is connected to the reset terminal RESET, a source of the thirteenth switch transistor T13 is connected to the second node PU2, and a drain of the thirteenth switch transistor T13 is connected to the reference voltage terminal VGL. A gate of the fourteenth switch transistor T14 is connected to the reset terminal RESET, a source of the fourteenth switch transistor T14 is connected to the second output terminal OUTPUT2, and a drain of the fourteenth switch transistor T14 is connected to the reference voltage terminal.

Figure 6:
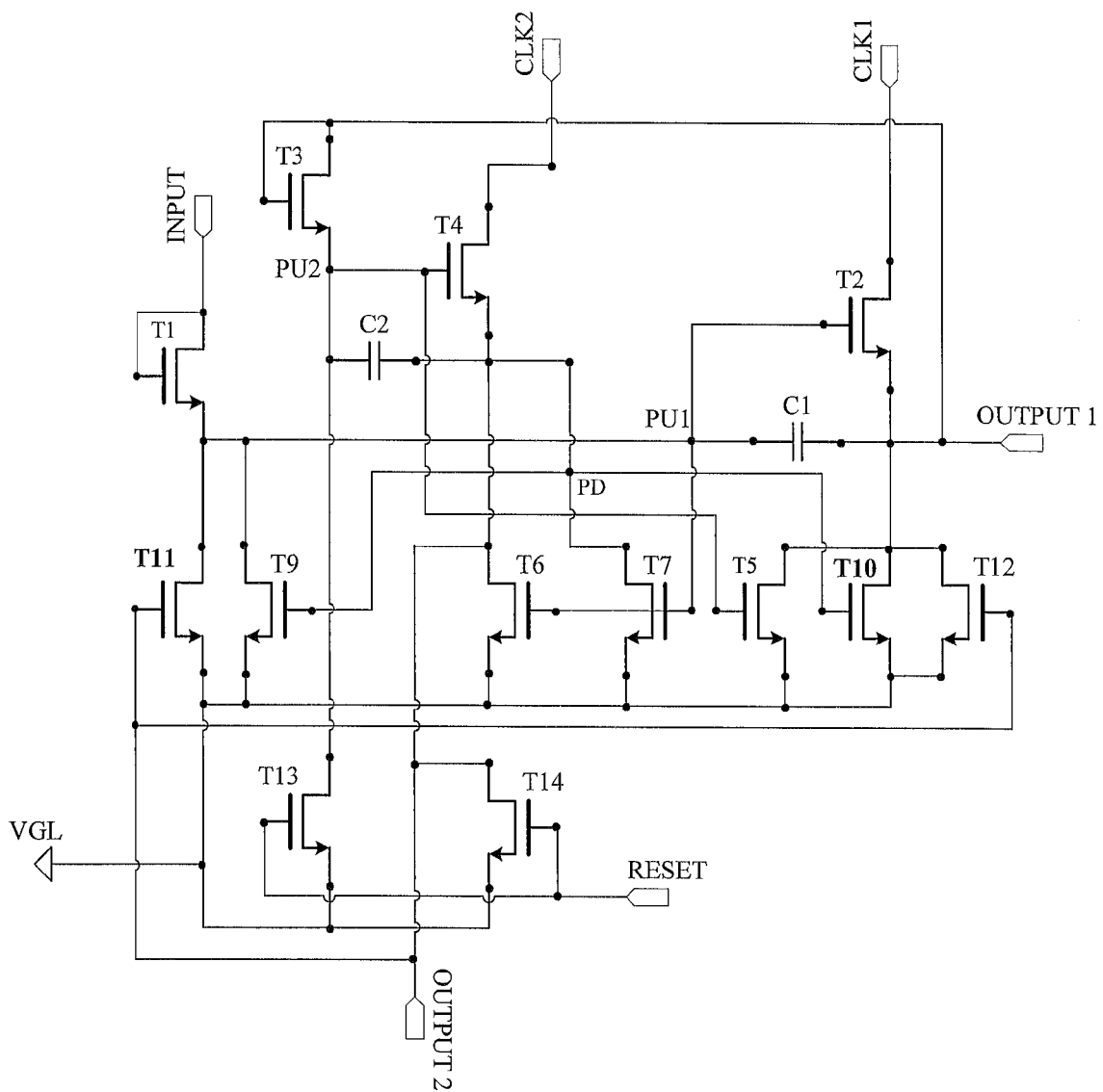
FIG. 6 is a schematic diagram showing a circuit structure of another shift register unit provided by an embodiment of the present disclosure.

Further, in an example, as shown in FIG. 6, in addition to those shown in FIG. 5, the pulling-down module further comprises:

a first input control unit, which comprises a fifth switch transistor T5, wherein a gate of the fifth switch transistor T5 is connected to the second node PU2, a source of the fifth switch transistor T5 is connected to the first output terminal OUTPUT1, and a drain of the fifth switch transistor T5 is connected to the reference voltage terminal VGL.

In an example, the first pulling-down unit further comprises a sixth switch transistor T6. A gate of the sixth switch transistor T6 is connected to the first node PU1, a source of the sixth switch transistor T6 is connected to the second output terminal OUTPUT2, and a drain of the sixth switch transistor T6 is connected to the reference voltage terminal VGL.

Figure 7:
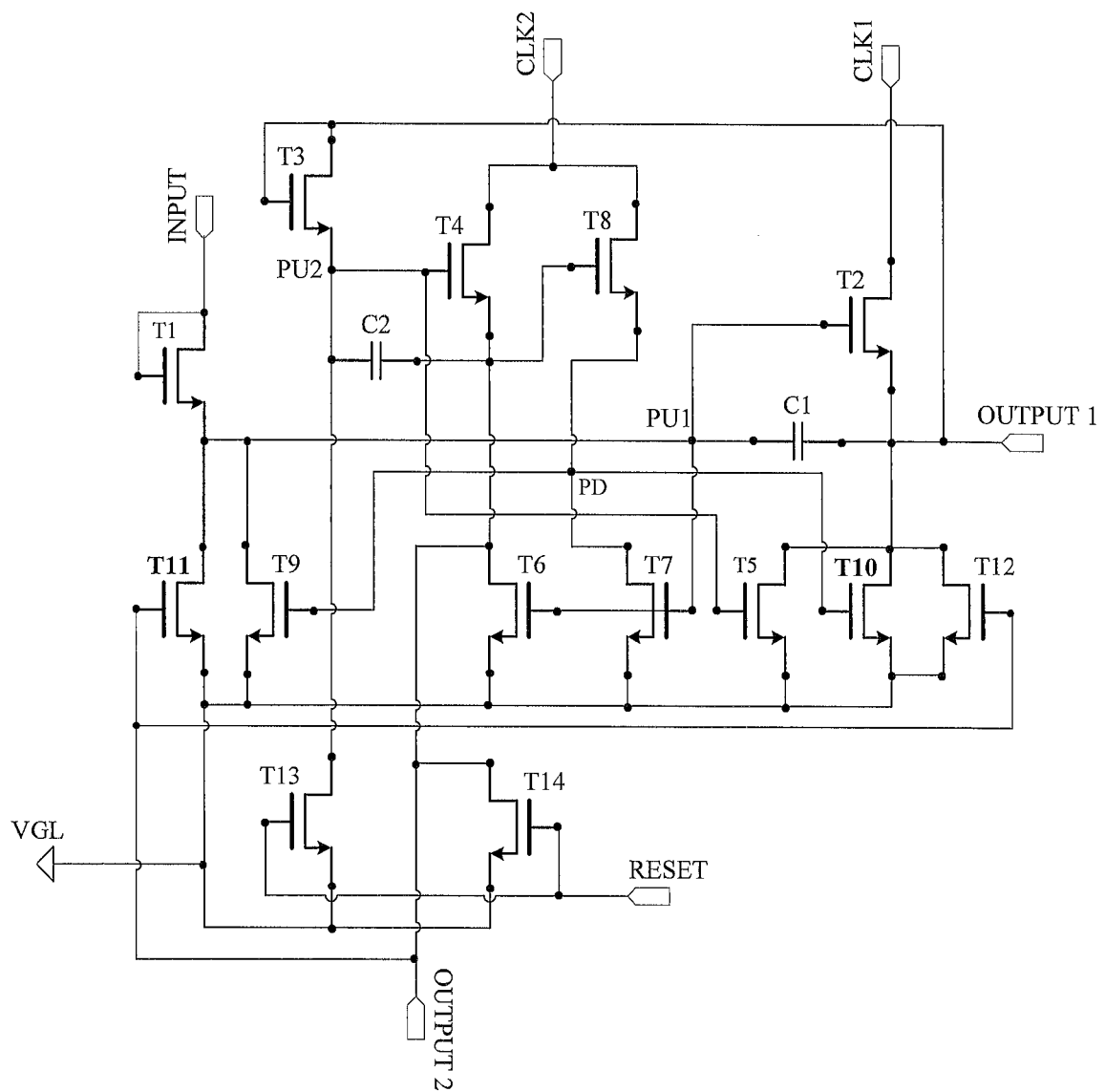
FIG. 7 is a schematic diagram showing a circuit structure of yet another shift register unit provided by an embodiment of the present disclosure.

Furthermore, in an example, as shown in FIG. 7, the second gate line driving signal module comprises a fourth switch transistor T4, an eighth switch transistor T8 and a second capacitor C2.

A source of the fourth switch transistor T4 is connected to the second clock signal terminal CLK2, a gate of the fourth switch transistor T4 is connected to the second node PU2, and a drain of the fourth switch transistor is connected to the second output terminal OUTPUT2. A gate of the eighth switch transistor T8 is connected to the second output terminal OUTPUT2, a source of the eighth switch transistor T8 is connected to the second clock signal terminal CLK2, and a drain of the eighth switch transistor T8 is connected to the third node PD. A first electrode of the second capacitor C2 is connected to the second node PU2, and a second electrode of the second capacitor C2 is connected to the second output terminal OUTPUT2.

Figure 8:
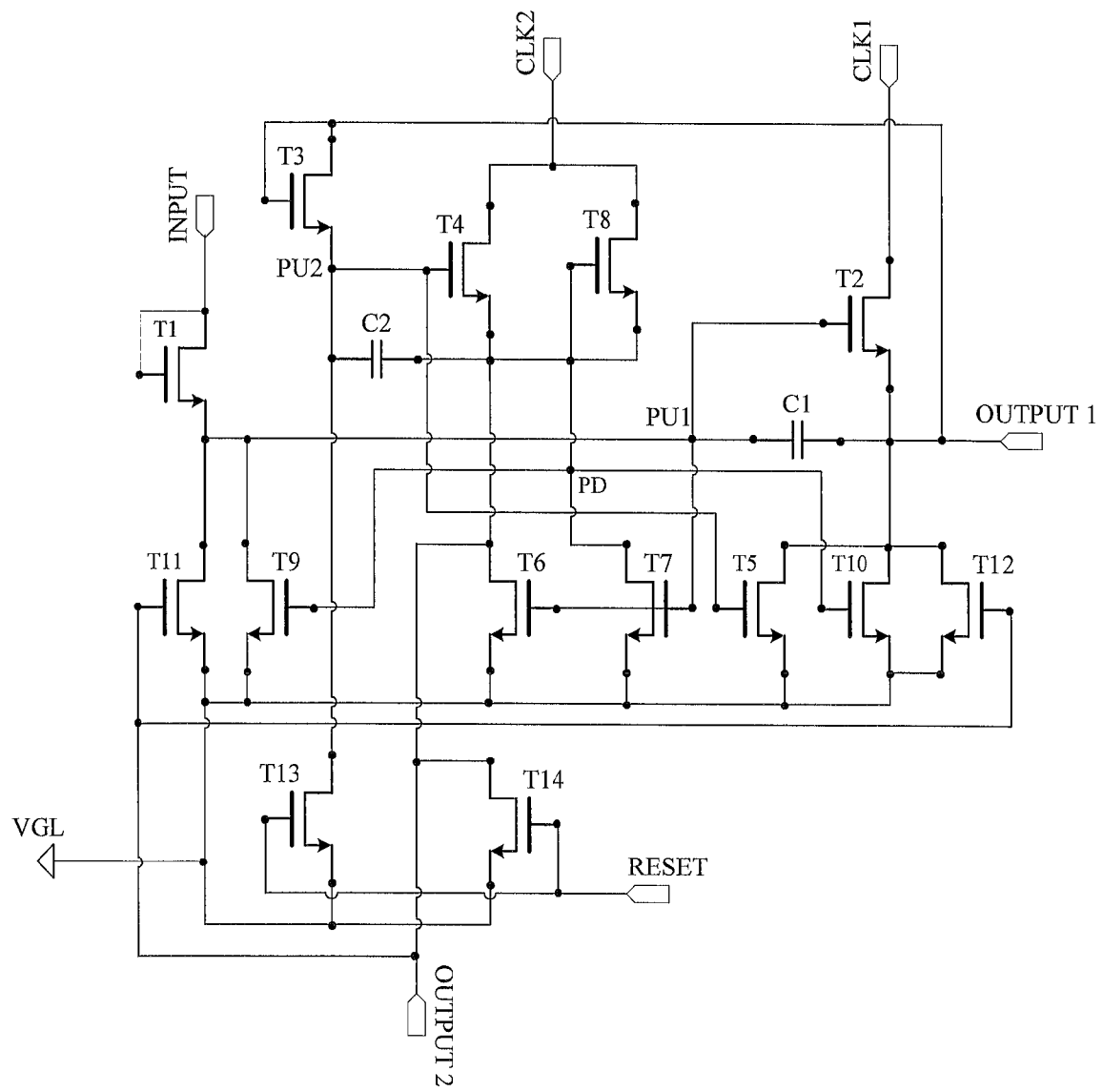
FIG. 8 is a schematic diagram showing a circuit structure of still another shift register unit provided by an embodiment of the present disclosure.

Alternatively, in another example, as shown in FIG. 8, further to the circuit structure shown in FIG. 7, the second output terminal OUTPUT2 is connected to the third node PD.

In the shift register unit provided by the embodiment of the present disclosure, the utilization of the two gate line driving signal modules enables one shift register unit to realize the outputting of two gate line signals, which is convenient to circuit integration designs of products and also facilitates an implementation of a narrow bezel product.

An embodiment of the present disclosure also provides a driving method for a shift register unit. Referring to the corresponding structure schematic diagram of the shift register unit of FIG. 2, and the timing state diagram shown in FIG. 9, the method comprises:

in a first stage, the first input module receives an input signal through an input terminal to input the first voltage to the first node until a potential at the first node reaches the first voltage, the first voltage is stored by the first gate line driving signal module, and the potential at the first node is maintained at the first voltage;

in a second stage, the first voltage controls the first gate line driving signal module to output a signal of the first clock signal terminal as the first gate line driving signal through the first output terminal, the first voltage controls the pulling-down module to pull voltages of the third node and the second output terminal to the voltage of the reference voltage terminal, the second input module inputs the second voltage to the second node under the action of the first gate line driving signal until a potential at the second node reaches the second voltage, the second voltage is stored by the second gate line driving signal module, and the potential at the second node is maintained at the second voltage;

in a third stage, the second voltage controls the second gate line driving signal module to output the signal of the second clock signal terminal as the second gate line driving signal through the second output terminal, the second gate line driving signal controls the third node to output the third voltage, the third node controls the pulling-down module to pull voltages of the first node and the first output terminal to the voltage of the reference voltage terminal, and the second gate line driving signal controls the pulling-down module to pull the voltages of the first node and the first output terminal to the voltage of the reference voltage terminal; and in a fourth stage, the resetting module receives the reset signal through the reset terminal to pull the voltages of the second node and the second output terminal to the voltage of the reference voltage terminal.

In an example, when the pulling-down module comprises the first pulling-down unit, the second pulling-down unit and the resetting unit, the second stage further comprises that the first voltage controls the first pulling-down module to pull the voltages of the third node and the second output terminal to the voltage of the reference voltage terminal;

the third stage further comprises that the third node controls the second pulling-down unit to pull the voltages of the first node and the first output terminal to the voltage of the reference voltage terminal, and the second gate line driving signal controls the resetting unit to further pull the voltages of the first node and the first output terminal to the voltage of the reference voltage terminal.

In an example, when the pulling-down module further comprises the first output control unit, in the third stage, the second voltage controls the first output control unit to pull the voltage of the first output terminal to the voltage of the reference voltage terminal.

In an example, when the first input module of the shift register unit comprises the first switch transistor, the first stage further comprises that the first switch transistor is turned on.

In an example, when the first gate line driving signal module of the shift register unit comprises the second switch transistor and the first capacitor, the first stage further comprises that the first capacitor is charged by the first voltage until the voltage at the first node rises to the first voltage, the first voltage is stored by the first capacitor, and the second switch transistor is turned on;

the second stage further comprises that the second switch transistor is turned on.

In an example, when the second input module of the shift register unit comprises the third switch transistor, the second stage further comprises that the third switch transistor is turned on.

In an example, when the second gate line driving signal module of the shift register unit comprises the fourth switch transistor and the second capacitor, the second stage further comprises that the second capacitor is charged by the second voltage until the voltage at the second node rises to the second voltage, the second voltage is stored by the second capacitor, and the fourth switch transistor is turned on;

the third stage further comprises that the fourth switch transistor is turned on.

In an example, when the second gate line driving signal module of the shift register unit comprises the fourth switch transistor, the eighth switch transistor and the second capacitor, the second stage further comprises that the second capacitor is charged by the second voltage until the voltage at the second node rises to the second voltage, the second voltage is stored by the second capacitor, and the fourth switch transistor is turned on;

the third stage further comprises that the fourth switch transistor is turned on, and the eighth switch transistor is turned on.

In an example, when the resetting module of the shift register unit comprises the thirteenth switch transistor and the fourteenth switch transistor, the fourth stage comprises that the thirteenth switch transistor and the fourteenth switch transistor are turned on.

In an example, when the first pulling-down unit of the shift register unit comprises the seventh switch transistor, the second stage further comprises that the seventh switch transistor is turned on.

In an example, when the first pulling-down unit of the shift register unit further comprises the sixth switch transistor, the second stage further comprises that the sixth switch transistor is turned on.

In an example, when the second pulling-down unit of the shift register unit comprises the ninth switch transistor and the tenth switch transistor, the third stage further comprises that the ninth switch transistor is turned on, and the tenth switch transistor is turned on.

In an example, when the resetting unit of the shift register unit comprises the eleventh switch transistor and the twelfth switch transistor, the third stage further comprises that the eleventh switch transistor and the twelfth switch transistor are turned on.

In an example, when the first output control unit of the shift register unit comprises the fifth switch transistor, the third stage further comprises that the fifth switch transistor is turned on.

Specifically, descriptions will be given by taking a case in which all the transistors are N-type transistors as an example. That is, when the gate voltage is at a high level, the corresponding switch transistor is in an ON state. At this time, the gate line driving signals outputted from the first output terminal and the second output terminal are both at the high level, while the reference voltage terminal can be at low level or be directly grounded to provide a pulling-down voltage for the circuit. Referring to the schematic diagram showing the circuit structure of the shift register unit provided by FIG. 5 and the driving timing signal diagram shown in FIG. 9, the following steps are comprised.

In the first stage, the first switch transistor T1 is turned on, the second switch transistor T2 is turned on, the first input module transmits the first voltage V1 of the input terminal to the first node PU1, the first voltage V1 is stored by the first capacitor C1 in the first gate line driving signal module, and the potential at the first node PU1 is maintained at the first voltage V1. In the first stage, as can be understood from a principle of charging of capacitors, due to the existence of the first capacitor C1, the voltage of the first node PU1 will not be maintained at the first voltage V1 until the charging of the first capacitor C1 is complete.

In the second stage, the first voltage V1 controls the first gate line driving signal module so as to keep the second switch transistor T2 to be turned on, and output a signal of the first clock signal terminal CLK1 as the first gate line driving signal through the first output terminal OUTPUT1. The first voltage V1 controls the first pulling-down unit to turn on the seventh switch transistor T7, and pulls the voltage of the third node PD to the voltage of the reference voltage terminal through the seventh switch transistor T7. The first gate line driving signal turns on the third switch transistor T3, the second input module inputs the first gate line driving signal to the second node PU2, which is stored by the second capacitor C2 in the second gate line driving signal module, and the voltage of the second node PU2 is maintained at the second voltage V2. Similarly, in the second stage, as can be understood from the principle of charging of capacitors, due to the existence of the second capacitor C2, the voltage of the second node PU2 will not be maintained at the second voltage V2 until the charging of the second capacitor C2 is complete.

In the third stage, the second voltage V2 controls the fourth switch transistor T4 to be turned on, and the second gate line driving signal module outputs a signal of the second clock signal terminal CLK2 as the second gate line driving signal through the second output terminal OUTPUT2.

At this point, since the second output terminal OUTPUT2 and the third node PD are directly connected with each other, the second gate line driving signal is directly used as the third voltage V3 of the third node. The third node controls the ninth switch transistor T9 of the second pulling-down unit to be turned on so as to pull the voltage of the first node PU1 to the voltage of the reference voltage terminal. Third node controls the tenth switch transistor T10 of the second pulling-down unit to be turned on so as to pull the voltage of the first output terminal OUTPUT1 to the voltage of the reference voltage terminal. The second gate line driving signal controls the eleventh switch transistor T11 and the twelfth switch transistor T12 to be turned on. The resetting unit pulls the voltage of the first node PU1 to the voltage of the reference voltage terminal through the eleventh switch transistor T11, and the resetting unit pulls the voltage of the first output terminal OUTPUT1 to the voltage of the reference voltage terminal through the twelfth switch transistor T12.

In the fourth stage, the resetting module receives the reset signal through the reset terminal RESET to turn on the thirteenth switch transistor T13 and the fourteenth switch transistor T14, and pulls the voltage of the second node PU2 to the voltage of the reference voltage terminal through the thirteenth switch transistor T13, and pulls the voltage of the second output terminal OUTPUT2 to the voltage of the reference voltage terminal through the fourteenth switch transistor T14.

In an example, referring to the schematic diagram of the circuit structure of the shift register unit as shown in FIG. 6, the shift register unit further comprises the sixth switch transistor T6 and the fifth switch transistor T5 in addition to those shown in FIG. 5.

In the second stage, the first voltage V1 controls the first pulling-down module to pull the voltage of the second output terminal OUTPUT2 to the voltage of the reference voltage terminal through the sixth switch transistor T6. Thus, a situation in which the second output terminal OUTPUT2 outputs overly can be avoided. Further, at this point, since the second clock signal terminal is at the low level, and the voltage of the reference voltage terminal is also at the low level, the fourth switch transistor T4 and the sixth switch transistor T6 constitute an inverter structure, so that this can form a dual pulling-down structure for the voltage of the second output terminal OUTPUT2, which can avoid the excess outputting at the second output terminal OUTPUT2. In addition, the fourth switch transistor T4 is also used for providing the second gate line driving signal in the third stage.

In the third stage, the second voltage V2 controls the fifth switch transistor T5 to be turned on, the first output control unit pulls the voltage of the first output terminal OUTPUT1 to the voltage of the reference voltage terminal through the fifth switch transistor T5. Herein, the reason why T5 is turned on in the third stage but not turned on in the second stage is that in the second stage the second voltage V2 charges the second capacitor C2, and thus the second node PU2 goes through a voltage rising process in the second stage. That is, it can be considered that the voltage at PU2 rises to the second voltage V2 upon end of the second stage, and only at this point can the turn-on condition for T5 be satisfied.

Further, in an example, as shown in FIG. 7, the second gate line driving signal module comprises the fourth switch transistor T4, the eighth switch transistor T8 and the second capacitor C2.

Thus, in the third stage, the second gate line driving signal controls the eighth switch transistor T8 to be turned on.

The signal of the second clock signal terminal CLK2 provides the third voltage V3 to the third stage PD, the third node PD controls the ninth switch transistor T9 of the second pulling-down unit to be turned on through the third voltage V3 so as to pull the voltage of the first node PU1 to the voltage of the reference voltage terminal. The third node PD controls the tenth switch transistor T10 of the second pulling-down unit to be turned on through the third voltage V3 to pull the voltage of the first output terminal OUTPUT1 to the voltage of the reference voltage terminal.

Alternatively, in an example, as shown in FIG. 8, the second output module comprises the fourth switch transistor T4, the eighth switch transistor T8 and the second capacitor C2, and further to FIG. 7, the second output terminal OUTPUT2 and the third node PD are directly connected with each other.

Thus, in the third stage, the second gate line driving signal controls the eighth switch transistor T8 to be turned on.

The signal of the second clock signal terminal CLK2 and the second gate line driving signal commonly provide the third voltage V3 to the third node PD. The third node PD controls the ninth switch transistor T9 of the second pulling-down unit to be turned on through the third voltage V3 so as to pull the voltage of the first node PU1 to the voltage of the reference voltage terminal, and the third node PD controls the tenth switch transistor T10 of the second pulling-down unit to be turned on through the third voltage V3 so as to pull the voltage of the first output terminal OUTPUT1 to the voltage of the reference voltage terminal.

As can be appreciated, the above description is based on the turn-on state of switch transistors. Naturally, when the type of a switch transistor is fixed, the control voltage for its gate is determinate. Therefore, there is no description as to whether the level of an input or output signal reflected in the timing diagrams is the high level or the low level. This can be readily appreciated by those skilled in the art. In addition, since the N-type transistors are employed in the above examples, and the N-type transistors will be turned on when the gate thereof is at the high level, the common voltage at the reference voltage terminal can be a ground voltage or the low level in order to facilitate circuit layout design. Of course, when a P-type transistor design is employed, the reference voltage terminal can be at the ground voltage or the high level.

Figure 10:
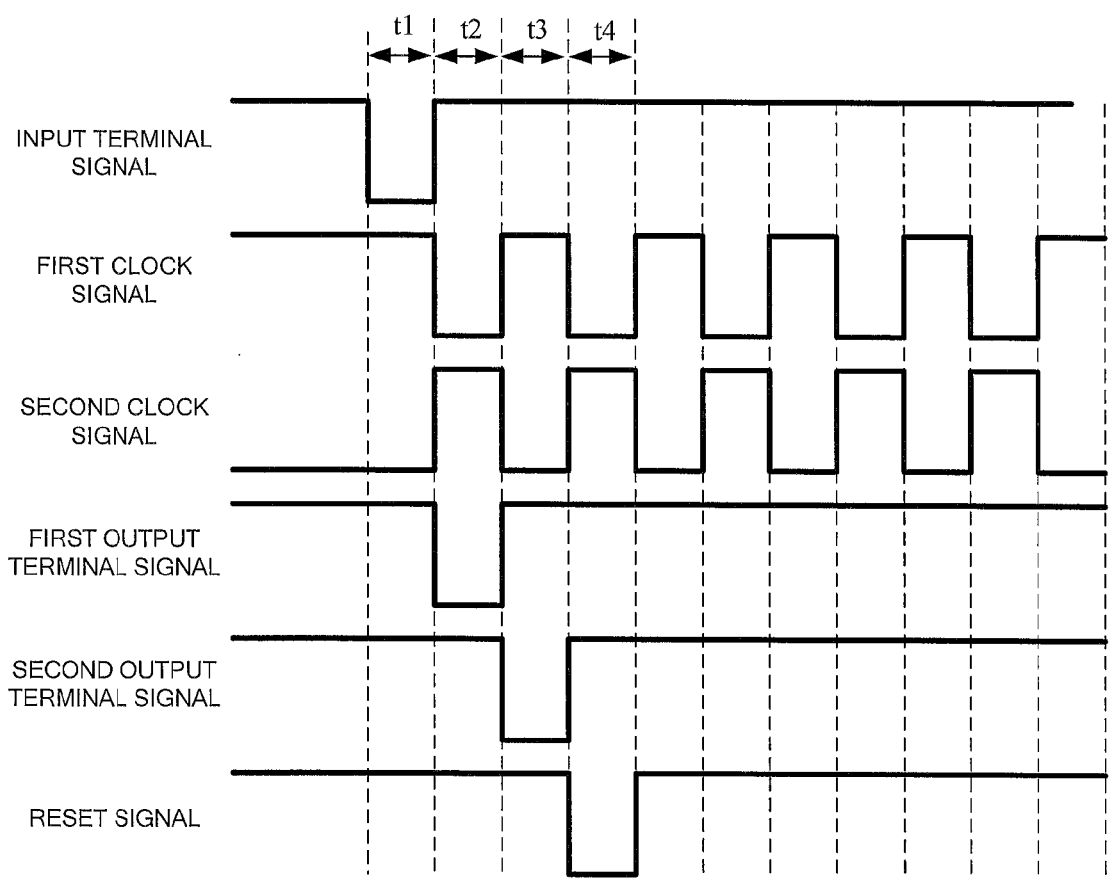
FIG. 10 is a driving timing signal diagram of a shift register unit provided by another embodiment of the present disclosure.

The embodiments of the present disclosure can also be realized by employing P-type transistors, as long as the timing of input signals is adjusted. Of course, if all the transistors employed are the P-type transistors, the driving method for the shift register unit as provided by the embodiments of the present disclosure can also be realized. However, in this case the signal timing as shown in FIG. 10 needs to be used. Specifically, as can be understood in connection with the afore-said embodiments, this is just about switching of signals between high level and low level, and detailed description will be omitted herein.

An embodiment of the present disclosure also provides an array substrate, on which a shift register circuit is formed; and the shift register circuit is the shift register circuit as provided by any of the above embodiments.

An embodiment of the present disclosure also provides a display apparatus. Specifically, the display apparatus includes the afore-said array substrate, on which a shift register circuit is formed; and the shift register circuit is the shift register circuit as provided by any of the above embodiments.

For example, when the display apparatus is a liquid crystal display apparatus, it comprises: a display region having a plurality of pixels for displaying an image; a shift register circuit for transmitting a scan signal to the display region; and a data driving circuit for transmitting a data signal to the display region. The shift register circuit is any one of the shift register circuits as described above. Also, the display apparatus can be any display device with a display function, such as a liquid crystal display panel, an organic electroluminescence device, an electronic paper, a mobile phone, a television set, a digital phone frame, or the like.

In the array substrate and the display apparatus provided by the embodiments of the present disclosure, the utilization of the two gate line driving signal modules enables one shift register unit to realize the outputting of two gate line signals, which is convenient to circuit integration designs of products and also facilitates an implementation of a narrow bezel product.

The above descriptions only illustrate the specific embodiments of the present invention, and the protection scope of the present invention is not limited to this. Given the teaching as disclosed herein, variations or substitutions, which can easily occur to any skilled pertaining to the art, should be covered by the protection scope of the present invention. Thus, the protection scope of the present invention is defined by the claims.

What is claimed is:

1. A shift register unit, comprising a first input module, a second input module, a first gate line driving signal module, a second gate line driving signal module, a pulling-down module and a resetting module, wherein
the first input module is connected to an input terminal and a first node, and is configured to input a first voltage to the first node;
the first gate line driving signal module is connected to a first clock signal terminal, a first output terminal and the first node, and is configured to store the first voltage and output a first gate line driving signal through the first output terminal under controls of the first voltage and a clock signal of the first clock signal terminal;
the second input module is connected to a second node and the first output terminal, and is configured to output a second voltage to the second node under an action of the first gate line driving signal;
the second gate line driving signal module is connected to a third node, a second output terminal, a second clock signal terminal and the second node, and is configured to output a second gate line driving signal through the second output terminal under controls of the second voltage and a clock signal of the second clock signal terminal, and output a third voltage at the third node;

the pulling-down module is connected to a reference voltage terminal, the first node, the third node, the first output terminal and the second output terminal, and is configured to pull voltages of the third node and the second output terminal to a voltage of the reference voltage terminal when the first output terminal outputs the first gate line driving signal, and pull voltages of the first node and the first output terminal to the voltage of the reference voltage terminal when the second output terminal outputs the second gate line driving signal; and the resetting module is connected to a reset terminal, the second node, the second output terminal and the reference voltage terminal, and is configured to pull the voltages of the second node and the second output terminal to the voltage of the reference voltage terminal under a control of a signal of the reset terminal.

2. The shift register unit according to claim 1, wherein the pulling-down module comprises a first pulling-down unit, a second pulling-down unit, and a resetting unit, the first pulling-down unit is connected to the first node, the third node, the second output terminal and the reference voltage terminal, and is configured to pull the voltages of the second output terminal and the third node to the voltage of the reference voltage terminal under the controls of the first voltage;

the second pulling-down unit is connected to the first node, the third node, the first output terminal and the reference voltage terminal, and is configured to pull the voltages of the first node and the first output terminal to the voltage of the reference voltage terminal under a control of the third voltage; and the resetting unit is connected to the first node, the first output terminal, the second output terminal and the reference voltage terminal, and is configured to pull the voltages of the first node and the first output terminal to the voltage of the reference voltage terminal under a control of the second gate line driving signal of the second output terminal.

3. The shift register unit according to claim 2, wherein the pulling-down module further comprises:

a first output control unit, connected to the second node, the first output terminal and the reference voltage terminal, and configured to pull the voltage of the first output terminal to the voltage of the reference voltage terminal under the control of the second voltage when the voltage at the second node reaches the second voltage.

4. The shift register unit according to claim 3, wherein first output control unit comprises a fifth switch transistor, wherein a gate of the fifth switch transistor is connected to the second node, a source of the fifth switch transistor is connected to the first output terminal, and a drain of the fifth switch transistor is connected to the reference voltage terminal.

5. The shift register unit according to claim 2, wherein the first pulling-down unit comprises a seventh switch transistor, wherein a gate of the seventh switch transistor is connected to the first node, a source of the seventh switch transistor is connected to the third node, and a drain of the seventh switch transistor is connected to the reference voltage terminal.

6. The shift register unit according to claim 5, wherein the first pulling-down unit further comprises a sixth switch transistor, wherein a gate of the sixth switch transistor is connected to the first node, a source of the sixth switch transistor is connected to the second output terminal, and a drain of the sixth switch transistor is connected to the reference voltage terminal.

7. The shift register unit according to claim 2, wherein the second pulling-down unit comprises:

a ninth switch transistor and a tenth switch transistor, wherein a gate of the ninth switch transistor is connected to the third node, a source of the ninth switch transistor is connected to the first node, and a drain of the ninth switch transistor is connected to the reference voltage terminal; and a gate of the tenth switch transistor is connected to the third node, a source of the tenth switch transistor is connected to the first output terminal, and a drain of the tenth switch transistor is connected to the reference voltage terminal.

8. The shift register unit according to claim 2, wherein the resetting unit comprises:

an eleventh switch transistor and a twelfth switch transistor, wherein a gate of the eleventh switch transistor is connected to the second output terminal, a source of the eleventh switch transistor is connected to the first node, and a drain of the eleventh switch transistor is connected to the reference voltage terminal; and a gate of the twelfth switch transistor is connected to the second output terminal, a source of the twelfth switch transistor is connected to the first output terminal, and a drain of the twelfth switch transistor is connected to the reference voltage terminal.

9. The shift register unit according to claim 1, wherein the first input module comprises:

a first switch transistor, wherein a source and a gate of the first switch transistor are connected to the input terminal, and a drain of the first switch transistor is connected to the first node.

10. The shift register unit according to claim 1, wherein the first gate line driving signal module comprises a second switch transistor and a first capacitor, wherein a first electrode of the first capacitor is connected to a gate of the second switch transistor and the first node, a second electrode of the first capacitor is connected to a drain of the second switch transistor, a source of the second switch transistor is connected to the first clock signal terminal, and the drain of the second switch transistor is connected to the first output terminal.

11. The shift register unit according to claim 1, wherein the second input module comprises a third switch transistor, wherein a source and a gate of the third switch transistor are connected to the first output terminal, and a drain of the third switch transistor is connected to the second node.

12. The shift register unit according to claim 1, wherein the second gate line driving signal module comprises a fourth switch transistor and a second capacitor, wherein a source of the fourth switch transistor is connected to the second clock signal terminal, a gate of the fourth switch transistor is connected to the second node, and a drain of the fourth switch transistor is connected to the second output terminal; and a first electrode of the second capacitor is connected to the second node, a second electrode of the second capacitor is connected to the second output terminal, and the second output terminal is connected to the third node.

13. The shift register unit according to claim 1, wherein the second gate line driving signal module comprises a fourth switch transistor, an eighth switch transistor and a second capacitor, wherein
   a source of the fourth switch transistor is connected to the second clock signal terminal, a gate of the fourth switch transistor is connected to the second node, and a drain of the fourth switch transistor is connected to the second output terminal;
   a gate of the eighth switch transistor is connected to the second output terminal, a source of the eighth switch transistor is connected to the second clock signal terminal, and a drain of the eighth switch transistor is connected to the third node; and
   a first electrode of the second capacitor is connected to the second node, and a second electrode of the second capacitor is connected to the second output terminal.

14. The shift register unit according to claim 13, wherein the second output terminal is connected to the third node.

15. The shift register unit according to claim 1, wherein the resetting module comprises a thirteenth switch transistor and a fourteenth switch transistor, wherein
   a gate of the thirteenth switch transistor is connected to the reset terminal, a source of the thirteenth switch transistor is connected to the second node, and a drain of the thirteenth switch transistor is connected to the reference voltage terminal; and
   a gate of the fourteenth switch transistor is connected to the reset terminal, a source of the fourteenth switch transistor is connected to the second output terminal, and a drain of the fourteenth switch transistor is connected to the reference voltage terminal.

16. The display apparatus according to claim 1, wherein the pulling-down module comprises a first pulling-down unit, a second pulling-down unit, and a resetting unit,
   the first pulling-down unit is connected to the first node, the third node, the second output terminal and the reference voltage terminal, and is configured to pull the voltages of the second output terminal and the third node to the voltage of the reference voltage terminal under the control of the first voltage;
   the second pulling-down unit is connected to the first node, the third node, the first output terminal and the reference voltage terminal, and is configured to pull the voltages of the first node and the first output terminal to the voltage of the reference voltage terminal under the control of the third voltage; and
   the resetting unit is connected to the first node, the first output terminal, the second output terminal and the reference voltage terminal, and is configured to pull the voltages of the first node and the first output terminal to the voltage of the reference voltage terminal under the control of the second gate line driving signal of the second output terminal.

17. The display apparatus according to claim 1, wherein the pulling-down module further comprises:
   a first output control unit, connected to the second node, the first output terminal and the reference voltage terminal, and configured to pull the voltage of the first output terminal to the voltage of the reference voltage terminal under the control of the second voltage when the voltage at the second node reaches the second voltage.

18. A driving method for a shift register unit, comprising:
   in a first stage, a first input module receives an input signal through an input terminal to input a first voltage to a first node until a potential at the first node reaches the first voltage, the first voltage is stored by a first gate line driving signal module, and the potential at the first node is maintained at the first voltage;
   in a second stage, the first voltage controls the first gate line driving signal module to output a signal of a first clock signal terminal as a first gate line driving signal through a first output terminal, the first voltage controls a pulling-down module to pull voltages of a third node and a second output terminal to a voltage of a reference voltage terminal, a second input module inputs a second voltage to a second node under an action of the first gate line driving signal until a potential at the second node reaches the second voltage, the second voltage is stored by the second gate line driving signal module, and the potential at the second node is maintained at the second voltage;
   in a third stage, the second voltage controls the second gate line driving signal module to output a signal of a second clock signal terminal as a second gate line driving signal through the second output terminal, the second gate line driving signal controls the third node to output a third voltage, the third node controls the pulling-down module to pull voltages of the first node and the first output terminal to the voltage of the reference voltage terminal, and the second gate line driving signal controls the pulling-down module to pull the voltages of the first node and the first output terminal to the voltage of the reference voltage terminal; and
   in a fourth stage, a resetting module receives a reset signal through a reset terminal to pull voltages of the second node and the second output terminal to the voltage of the reference voltage terminal.

19. A display apparatus comprising a shift register circuit, wherein the shift register circuit comprises a plurality of shift register units connected in cascade,
   except for the first shift register unit and the last shift register unit, an input terminal of each of the shift register units is connected to a second output terminal of an adjacent previous shift register unit, a first output terminal of each of the shift register units is connected to a reset terminal of an adjacent previous shift register unit, a second output terminal of each of the shift register units is connected to an input terminal of an adjacent next shift register unit, and a reset terminal of each of the shift register units is connected to a first output terminal of the adjacent next shift register unit,
   wherein each of the shift register units comprises a first input module, a second input module, a first gate line driving signal module, a second gate line driving signal module, a pulling-down module and a resetting module, wherein
   the first input module is connected to the input terminal and a first node, and is configured to input a first voltage to the first node;
   the first gate line driving signal module is connected to a first clock signal terminal, the first output terminal and the first node, and is configured to store the first voltage and output a first gate line driving signal through the first output terminal under controls of the first voltage and a clock signal of the first clock signal terminal;
   the second input module is connected to a second node and the first output terminal, and is configured to output a second voltage to the second node under an action of the first gate line driving signal;
   the second gate line driving signal module is connected to a third node, the second output terminal, a second clock signal terminal and the second node, and is configured to output a second gate line driving signal through the second output terminal under controls of the second voltage and a clock signal of the second clock signal terminal, and output a third voltage at the third node;

the pulling-down module is connected to a reference voltage terminal, the first node, the third node, the first output terminal and the second output terminal, and is configured to pull voltages of the third node and the second output terminal to a voltage of the reference voltage terminal when the first output terminal outputs the first gate line driving signal, and pull voltages of the first node and the first output terminal to the voltage of the reference voltage terminal when the second output terminal outputs the second gate line driving signal; and the resetting module is connected to the reset terminal, the second node, the second output terminal and the reference voltage terminal, and is configured to pull the voltages of the second node and the second output terminal to the voltage of the reference voltage terminal under a control of a signal of the reset terminal.

* * * * *